United States Patent
Van Rens

(10) Patent No.: US 9,318,686 B2
(45) Date of Patent: Apr. 19, 2016

(54) DRIVER DEVICE AND DRIVING METHOD FOR DRIVING A CAPACITIVE LOAD, IN PARTICULAR AN ULTRASOUND TRANSDUCER

(71) Applicant: KONINKLIJKE PHILIPS N.V., Eindhoven (NL)

(72) Inventor: Antonia Cornelia Van Rens, Eindhoven (NL)

(73) Assignee: Koninklijke Philips N.V., Eindhoven (NL)

(*) Notice: Subject to any disclaimer, the term of this patent is extended or adjusted under 35 U.S.C. 154(b) by 0 days.

(21) Appl. No.: 14/362,609

(22) PCT Filed: Dec. 12, 2012

(86) PCT No.: PCT/IB2012/057223
§ 371 (c)(1),
(2) Date: Jun. 4, 2014

(87) PCT Pub. No.: WO2013/088359
PCT Pub. Date: Jun. 20, 2013

(65) Prior Publication Data
US 2014/0327378 A1 Nov. 6, 2014

Related U.S. Application Data

(60) Provisional application No. 61/570,861, filed on Dec. 15, 2011.

(51) Int. Cl.
*H01L 41/04* (2006.01)
*B06B 1/02* (2006.01)

(52) U.S. Cl.
CPC ............. *H01L 41/042* (2013.01); *B06B 1/023* (2013.01)

(58) Field of Classification Search
CPC ...................................................... H01L 41/04
USPC ............................................. 318/116, 34, 558
See application file for complete search history.

(56) References Cited

U.S. PATENT DOCUMENTS

| 5,473,526 | A | * | 12/1995 | Svensson et al. | ................ 363/60 |
| 5,581,454 | A | * | 12/1996 | Collins | ............................ 363/59 |
| 6,985,142 | B1 | * | 1/2006 | Svensson | ............. G09G 3/3688 345/211 |
| 7,663,618 | B2 | * | 2/2010 | Svensson et al. | ............. 345/211 |

* cited by examiner

*Primary Examiner* — David S Luo

(57) ABSTRACT

The present invention relates to a driver device (40; 60) for driving a capacitive load (12), in particular an ultrasound transducer (12) having one or more transducer elements, comprising an output terminal (42; 68) for providing an alternating drive voltage (V14; V22) to the load (12), a plurality of voltage supply elements (46, 48, 50, 52; 72, 74) for providing intermediate voltage levels (V16), a plurality of controllable connecting means (S0-S7) each associated to one of the voltage supply elements (46, 48, 50, 52; 72, 74) for connecting the voltage supply elements (46, 48, 50, 52; 72, 74) to the output terminal (42; 68) and for supplying one of the intermediate voltage levels (V16) or a sum of a plurality of the intermediate voltage levels (V16) as the alternating drive voltage (V14; V22) to the output terminal.

13 Claims, 5 Drawing Sheets

DRIVER DEVICE AND DRIVING METHOD FOR DRIVING A CAPACITIVE LOAD, IN PARTICULAR AN ULTRASOUND TRANSDUCER

This application is the U.S. National Phase application under 35 U.S.C. §371 of International Application No. PCT/IB2012/057223, filed on Dec. 12, 2012, which claims the benefit of U.S. Provisional Application No.61/570,861 filed on Dec. 15, 2011. These applications are hereby incorporated by reference herein.

FIELD OF THE INVENTION

The present invention relates to a driver device and a corresponding driving method for driving a capacitive load, in particular an ultrasound transducer comprising one or more transducer elements. Further, the present invention relates to an ultrasound apparatus.

BACKGROUND OF THE INVENTION

In the field of ultrasound transducers the use of piezoelectric transducers such as lead zirconate titanate (PZT) transducers and, nowadays, MEMS transducers such as capacitive micro-machined ultrasound transducer (cMUT) devices is common practice for providing two or three dimensional ultrasound waves. The micro-machined technology in this field allows small feature sizes and the realization of high-frequency beam-forming arrays, which can be formed monolithically on the same wafer.

The existing ultrasound transducers have a limited power factor and a limited efficiency due to a limited coupling factor. The coupling factor of ultrasound transducers represents a ratio of the stored and delivered mechanical energy to the total electrical energy in a lossless vibration cycle. Common coupling factors of cMUTs are in the range of 50%, while the effective coupling sector could be even lower. Practically, the transducer driver circuit has to provide more electrical energy to the transducer than the amount of acoustic energy which is delivered by the transducer. The remaining energy is conserved in the reactive parts of the transducer or is dissipated in the resistive parts and converted into lost heat. The conserved energy, which is mainly capacitive electrical energy, may be delivered back to the driver circuit and depending on the driver type, the energy can be reduced during a following vibration cycle or is dissipated in the driver circuit.

A common method to conserve energy at the driver device is to use an additional reactive device, i.e. an inductor, which operates in terms of energy storage in anti-phase with the transducer. In the case of two dimensional transducer arrays having discrete driver electronics, the discrete inductors are used in series with the driver. For three dimensional ultrasound arrays including thousands of transducers and in the case of integrated electronics, the respective inductors would strongly increase the overall size of the driver device.

SUMMARY OF THE INVENTION

It is therefore an object of the present invention to provide an improved driver device and a corresponding driving method for driving a capacitive load, in particular an ultrasound transducer having one or more transducer elements, providing an increased power factor and a reduced increased coupling factor. Further, it is an object of the present invention to provide a corresponding ultrasound apparatus.

According to one aspect of the present invention a driver device for driving a capacitive load, in particular an ultrasound transducer having one or more transducer elements, is provided comprising:
 an output terminal for providing an alternating drive voltage to the load,
 a plurality of voltage supply elements for providing intermediate voltage levels,
 a plurality of controllable connecting means each associated to one of the voltage supply elements for connecting the voltage supply elements to the output terminal and for supplying one of the intermediate voltage levels or a sum of a plurality of the intermediate voltage levels as the alternating drive voltage to the output terminal.

According to another aspect of the present invention, a driving method for driving a capacitive load, in particular an ultrasound transducer including one or more transducer elements, wherein the driving method comprises the steps of:
 providing an alternating drive voltage to the load,
 providing a plurality of intermediate voltage levels by means of a plurality of voltage supply elements, and
 connecting the voltage supply elements sequentially to the load to provide a stepwise rising or falling voltage as the alternating drive voltage to the load.

According to still another aspect of the present invention an ultrasound apparatus is provided comprising an ultrasound transducer comprising one or more transducer elements, in particular capacitive micro-machined ultrasound transducer elements, and a driver device for driving said ultrasound transducer elements as provided according to the present invention.

Preferred embodiments of the invention are defined in the dependent claims. It shall be understood that the claimed method has similar and/or identical preferred embodiments as the claimed device and as defined in the dependent claims.

The present invention is based on the idea to provide a driver device for driving a capacitive load that provides intermediate voltage levels or a sum of the intermediate voltage levels to the capacitive load to prevent the load of being charged from zero voltage to the maximum voltage in one step in order to prevent most of the energy to dissipate in the respective switching element which connects the load to the supply voltage. To reduce the electrical energy dissipated in the switching element, the driver device according to the present invention comprises a plurality of voltage supply elements which supply intermediate voltage levels to form the whole supply voltage and provide one or a sum of the intermediate voltage levels to charge the capacitive load accordingly. Since the electrical charge energy of a sum of the intermediate voltage levels provided to the capacitive load is reduced compared to the electrical energy provided by the whole supply voltage applied to the load in one step, the power dissipation can be reduced. Hence, providing the intermediate voltage levels or a sum of the intermediate voltage levels can provide a more flexible driver device and can reduce the power consumption due to switching between one of the intermediate voltage levels or a sum of the intermediate voltage levels supplied to the capacitive load. Since the electrical charge energy drawn from the power source is reduced during charging and increased during discharging and supplied back to the power source by applying the intermediate voltage levels to the load, the dissipation energy is reduced and the coupling factor is improved.

In a preferred embodiment, the voltage supply elements are connected in series to each other. This is a simple solution to add the intermediate voltage levels to a full supply voltage for supplying to the capacitive load.

In a further embodiment, the connecting means comprise a plurality of controllable switches each connected to one voltage supply element and to the output terminal. This provides an effective circuit to connect the intermediate voltage levels of one of the voltage supply elements or a plurality of the voltage supply elements to the output terminal and to provide the intermediate voltage levels or a sum of the intermediate voltage levels to the load with low technical effort.

In a preferred embodiment, the voltage supply elements are separate voltage sources, each providing one of the intermediate voltage levels. This is a simple and reliable solution to provide intermediate voltage levels to the load.

According to a further preferred embodiment, the voltage supply elements are voltage divider elements forming a series connection, wherein the series connection comprises input terminals for connecting the driver device to an external power supply. This is a cheap solution to form the intermediate voltage levels from an external supply voltage with low technical effort, wherein the voltage divider divides the external supply voltage into the different intermediate voltage levels as desired.

According to an alternative embodiment, the voltage supply elements are voltage conversion units, in particular DC-DC voltage converter, connected to an external power supply for converting an external voltage to the intermediate voltage levels. This is a solution to convert the external voltage to the intermediate voltage levels having a high power efficiency.

In a preferred embodiment, the driver device comprises a control unit for controlling the controllable connecting means, wherein the control unit is provided for connecting the voltage supply elements sequentially to the output terminal for providing a stepwise rising or a stepwise falling drive voltage. This provides a simple solution to apply the supply voltage to the load having a reduced power dissipation due to the reduced voltage level, which is applied during each of the voltage steps. In other words, the voltage across the switch is reduced. This reduces the power dissipation in the switch.

In a preferred embodiment, the driver device further comprises a second output terminal wherein the drive voltage is provided between the first and the second output terminal. This provides a simple solution to drive both input terminals of the capacitive load actively by means of two separate voltage supply elements.

According to a preferred embodiment, voltage supply means are connected to the second output terminal for supplying a bias voltage to the second output terminal. This is a possibility to provide a voltage offset between the two voltage potentials of the first and the second output terminal with low technical effort to increase the drive voltage supplied to the capacitive load.

According to a preferred embodiment, the driver device comprises a second plurality of voltage supply elements for providing intermediate voltage levels and a second plurality of controllable connecting means each associated to one of the second voltage supply elements for connecting the second voltage supply elements to the second output terminal. This provides a circuit structure of the driver device to drive both output terminals actively with low technical effort.

According to a preferred embodiment, the control unit is provided for controlling the first and the second plurality of connecting means and wherein the control unit is provided for connecting the voltage supply elements sequentially to the respective output terminal to provide a stepwise rising or falling drive voltage. This provides a driver device with low technical effort since the amount of control units is reduced.

As mentioned above, the present invention provides a solution to reduce the power dissipation of a driver device for driving a capacitive load, since intermediate voltage levels or a sum of intermediate voltage levels are supplied to the load and the charge energy corresponding to the dissipated energy is proportional to the square of the supplied voltage. If the intermediate voltage levels are provided stepwise to the load, the electrical charge energy applied to the load is reduced and, therefore, also the power dissipation can be reduced. Hence, the efficiency of the driver device and the coupling factor of the ultrasound transducer can be increased.

BRIEF DESCRIPTION OF THE DRAWINGS

These and other aspects of the invention will be apparent from and elucidated with reference to the embodiments described hereinafter. In the following drawings

DETAILED DESCRIPTION OF THE INVENTION

Figure 1A:
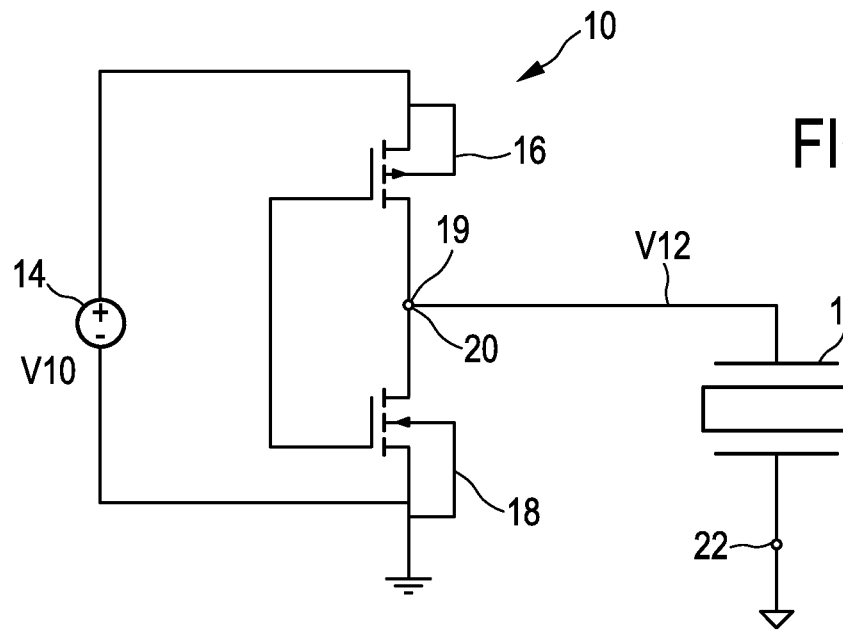
FIG. 1a shows a schematic block diagram of a known driver device for driving an ultrasound transducer.

FIG. 1 shows an embodiment of a known driver device 10 (also known as pulser) for driving an ultrasound transducer 12. The driver device 10 is connected to a power source 14, which provides a supply voltage V10 to the driver device 10. The driver device 10 comprises two transistors 16, 18, which are connected in an inverter configuration to each other and connected to the power supply 14. The ultrasound transducer 12 is electrically connected to drain connectors of transistors 16, 18. By closing transistor 16 (make transistor 16 conductive), an output node 19 of the driver device 10 is connected to V10, by closing transistor 18, the output node 19 is connected to GND. The ultrasound transducer 12 comprises two input terminals 20, 22, wherein the first input terminal 20 is electrically connected to the output node 19 of the driver device 10 and the second input terminal 22 is connected to neutral or a bias voltage; dependent on the used transducer type (cMUT, PZT, etc.). The supply voltage V10 is provided to the transducer 12 in a pulsed form by switching the transistors 16, 18 alternating on and off. In other words, the transducer is either connected to the high potential of the voltage supply 14 or to neutral or the low potential of the power supply 14 to provide a pulsed drive voltage V12 to the ultrasound transducer 12.

Figure 1B:
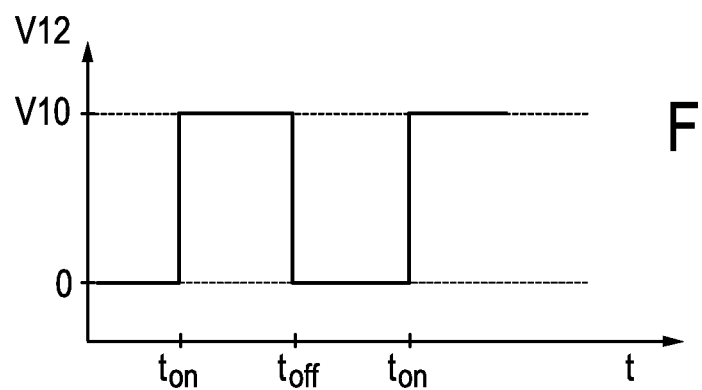
FIG. 1b shows a timing diagram of a pulsed driving voltage for driving an ultrasound transducer.

A timing diagram of the pulsed drive voltage V12 is shown in FIG. 1b. The pulsed drive voltage V12 is alternating between zero and V10. The voltage level V12 is increased at t_on from 0 to V10 when the transistor 16 is switched on and the transistor 18 is switched off and the drive voltage V12 is switched from V10 to zero at t_off when the transistor 16 is switched off and the transistor 18 is switched on. Hence, the pulsed drive voltage V12 is alternating between 0 and the supply voltage V10 and the voltage level is increased or decreased in one step.

Figure 1C:
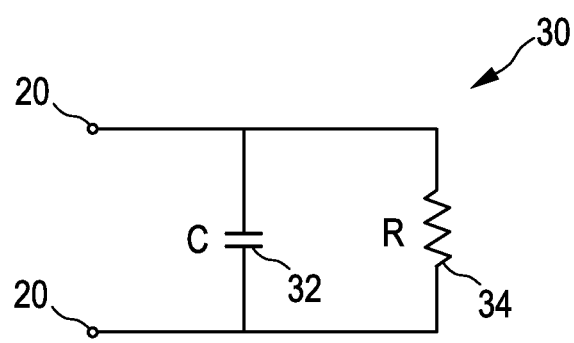
FIG. 1c shows a simple electrical circuit model of an ultrasound transducer useful when the transducer is operating close to its resonance frequency.

FIG. 1c shows a schematic drawing of a simple electrical circuit model of the ultrasound transducer 12 generally denoted by 30. This model 30 is valid when the transducer 12 is operating close to its resonance frequency. The electrical circuit model 30 comprises a capacitor 32 and a resistor 34 connected in parallel to each other. The capacitor 32 having the capacity C and the resistor 34 having the resistance R are each connected to the input terminals 20, 22, which are provided to connect the transducer to the driver device 10. In this electrical circuit model 30, the capacitor 32 represents the parallel plate capacitance of the ultrasound transducer 12 in combination with capacities (parasitic capacitances) of electronics and/or interconnects. The energy consumed in resistor 34 represents the energy that is converted by the ultrasound transducer into acoustic energy.

The capacitor 32 is charged to the voltage V10 between t_on and t_off and is discharged to 0 volt between t_off and t_on. The electrical energy, which is stored in the capacitor 32 when discharged from the voltage level V10 to ground (or when charged from ground to V10) is given by $$E_D = \frac{C*(V10)^2}{2}$$

wherein $E_D$ is the electrical energy stored in the capacitor 32 and C is the capacity of the capacitor 32. If a bias voltage is considered, the electrical energy would be different. The electrical energy, which is necessary to charge the capacitor 32 from 0 V to V10 using a DC supply voltage like V10 is given by $$E_C = C*(V10)^2$$

wherein $E_C$ is the energy necessary to charge the capacitor 32 and C is the capacity of the capacitor 32. The energy difference $E_C$-$E_D$ is dissipated in the transistor 16 during the charging of the capacitor 32 and the energy $E_D$ is dissipated in the transistor 18 when the capacitor 32 is discharged. After a full switching cycle all electrical energy provided by the driver device 10 is dissipated in the switches and converted to heat.

Figure 2:
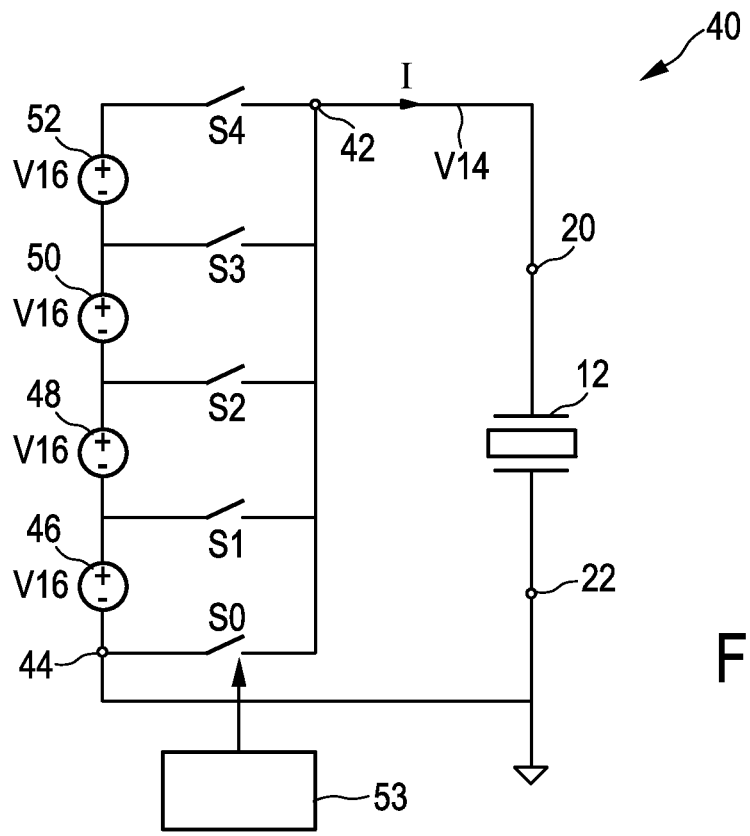
FIG. 2 shows a schematic block diagram of a first embodiment of a driver device for driving an ultrasound transducer.

FIG. 2 shows a schematic block diagram of a driver device according to a first embodiment of the present invention. The driver device in FIG. 2 is generally denoted by 40.

The driver device 40 comprises an output terminal 42 to provide an output voltage V14 and a drive current I to the ultrasound transducer 12. The driver device 40 comprises a second output terminal 44, which is connected to neutral or a bias voltage (dependent on the used transducer type).

The driver device 40 comprises four voltage supply elements 46, 48, 50, 52. Each of the voltage supply elements 46-52 provides an intermediate voltage V16 as a partial voltage V16 of the supply voltage V10. A sum of the intermediate voltage levels V16 is identical with the supplied voltage V10. The intermediate voltage levels V16 are preferably identical and in this embodiment V16=0.25*V10. In an alternative embodiment, the intermediate voltage levels V16 are different from each other, wherein the sum of the intermediate voltage levels V16 is still identical to the supply voltage V10. The voltage supply elements 46-52 are connected in series to each other. The voltage supply elements 46-52 are each connected to a control switch S0, S1, S2, S3, S4, which are connected to the output terminal 42. The control switches S0-S4 are connected to each voltage potential provided by the voltage supply elements 46-52, so that each potential can be provided to the output terminal 42. The switches S0-S4 are controlled by a control unit 53. In other words, the control switch S0 is connected to the second output terminal 44 and, therefore, connected to neutral so that the drive voltage V14 is 0, if the control switch S0 is closed. The control switches S1, S2, S3 are connected between the voltage supply elements 46-52, so that the voltage potential V16, 2*V16 and 3*V16 can be supplied to the output terminal 42. The control switch S4 is connected to the voltage supply element 52, such that a voltage potential 4*V16 can be provided to the output terminal 42. The switches S0-S4 have to be switched sequentially. In other words, an overlapping of the respective conduction phases of the switches S0-S4 and the respective short circuits should be avoided in any case. According to an alternative embodiment, the switches S0-S4 are provided in a combined parallel/series connection of switches to avoid any short circuits.

Hence, any of the voltage potentials at or between the voltage supply elements 46-52 can be provided to the output terminal 42 by switching the control switches S0-S4. In other words, 0 V, the supply voltage V10 and the intermediate voltage levels can be provided by the driver device 40. Hence, a stepwise rising or stepwise falling drive voltage V14 can be provided to the ultrasound transducer 12.

Figure 3:
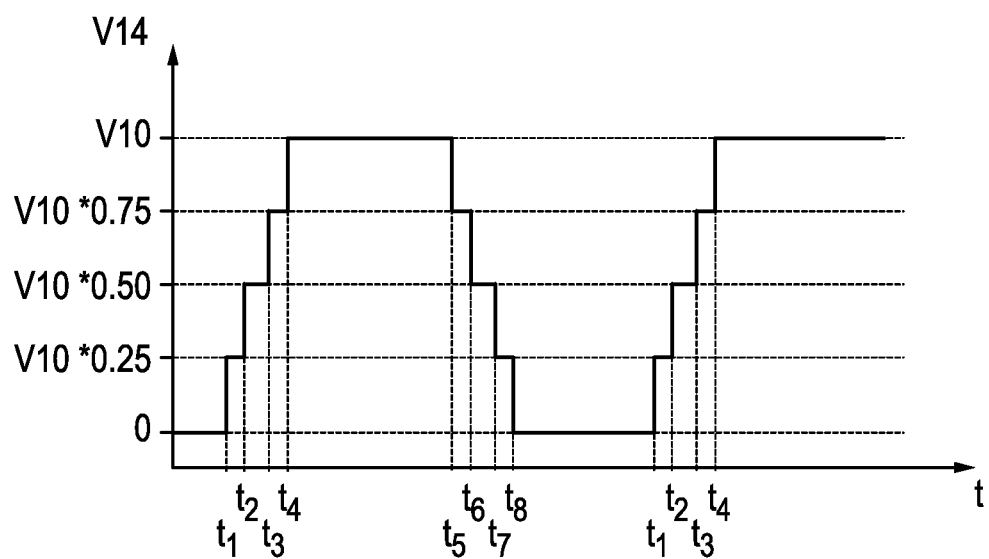
FIG. 3 shows an example of a driving pulse of a driving voltage provided by the driver device of FIG. 2.

FIG. 3 is a timing diagram showing the pulsed driving voltage V14 provided by the driver device 40 of FIG. 2. The pulsed driving voltage V14 is increased from 0 to V10 stepwise in four steps. The pulsed drive voltage V14 is increased at t1 from 0 to 0.25*V10, which is identical to V16. The pulsed drive voltage V14 is increased at t2 from 0.25*V10 to 0.5*V10, i.e. from V16 to 2*V16. At t3 and t4 the pulsed drive voltage V14 is in each case increased by the intermediate voltage V16 to reach the supply voltage V10 at t4. Hence, the drive voltage V14 is increased stepwise from 0 to V10 in voltage steps of the intermediate voltage level V16. From t5 to t8 the pulsed drive voltage V14 is decreased stepwise in steps of the intermediate voltage level V16. At t5 the pulsed drive voltage V14 is decreased by the intermediate voltage V16 from V10 to 0.75*V10 or, in other words, from 4*V10 to 3*V10. At t6, t7 and t8 the pulsed supply voltage V14 is in each case decreased by the intermediate voltage level V16 until the pulsed drive voltage V14 is zero.

Hence, the pulsed drive voltage level V14 is increased stepwise from 0 to supply voltage V10 in steps of the intermediate voltage level V16 and decreases from the supply voltage V10 stepwise in steps of the intermediate voltage level V16.

The stepwise rising pulsed drive voltage V14 as shown in FIG. 3 is provided by switching one of the control switches S0-S4 to apply the respective voltage potential to the output terminal 42. Hence, 0 V or the intermediate voltage V16 or a sum of the intermediate voltages V16 can be provided to the output terminal 42. By means of a consecutive closing and opening of the switches S0-S4, the stepwise rising and stepwise falling pulsed drive voltage V14 can be provided.

Figure 4:
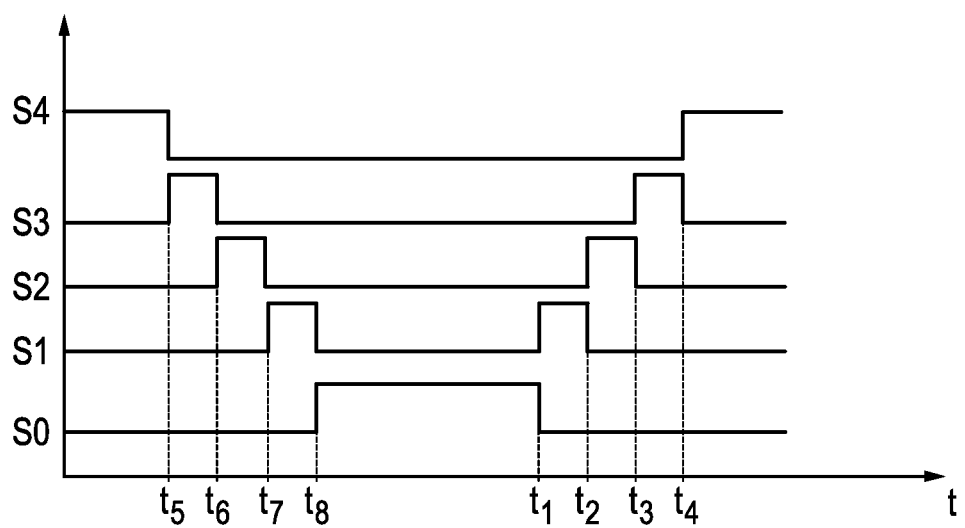
FIG. 4 shows a timing diagram of control signals for the driver device to provide a driving pulse.

In FIG. 4 a timing diagram of control signals for the control switches S0-S4 is schematically shown. The control signals are provided by the control unit 53 to control the control switches S0-S4 to connect the supply voltage V10=4*V16 to the output terminal 42, i.e. the control switch S4 is closed. At t5 the control switch S4 is switched off and the control switch S3 is switched on. Hence, the voltage potential 3*V10 is provided to the output terminal 42. At t6 the control switch S3 is switched off and the control switch S2 is switched on to provide 2*V16 to the output terminal 42. At t8 the control switch S1 is switched off and the control switch S0 is switched on so that the output terminal 42 is connected to neutral and the pulsed driving voltage V14 is 0. At t1 the control switch S0 is switched off and the control switch S1 is switched on to provide the intermediate voltage V16 to the output terminal 42. At t2 and t3 the control switches S1, S2, S3 are switched on and off respectively to provide the respective sum of the intermediate voltage V16 to the output terminal and at t4 the control switch S3 is switched off and the control switch S4 is switched on to provide the supply voltage V10=4*V16 to the output terminal 42. As mentioned above, the switches S0-S4 should be actuated sequentially and an overlapping of the control signals should be avoided to prevent short circuits. Hence, the stepwise rising and falling pulsed drive voltage V14 can be realized by the control signals schematically shown in FIG. 4.

Figure 5:
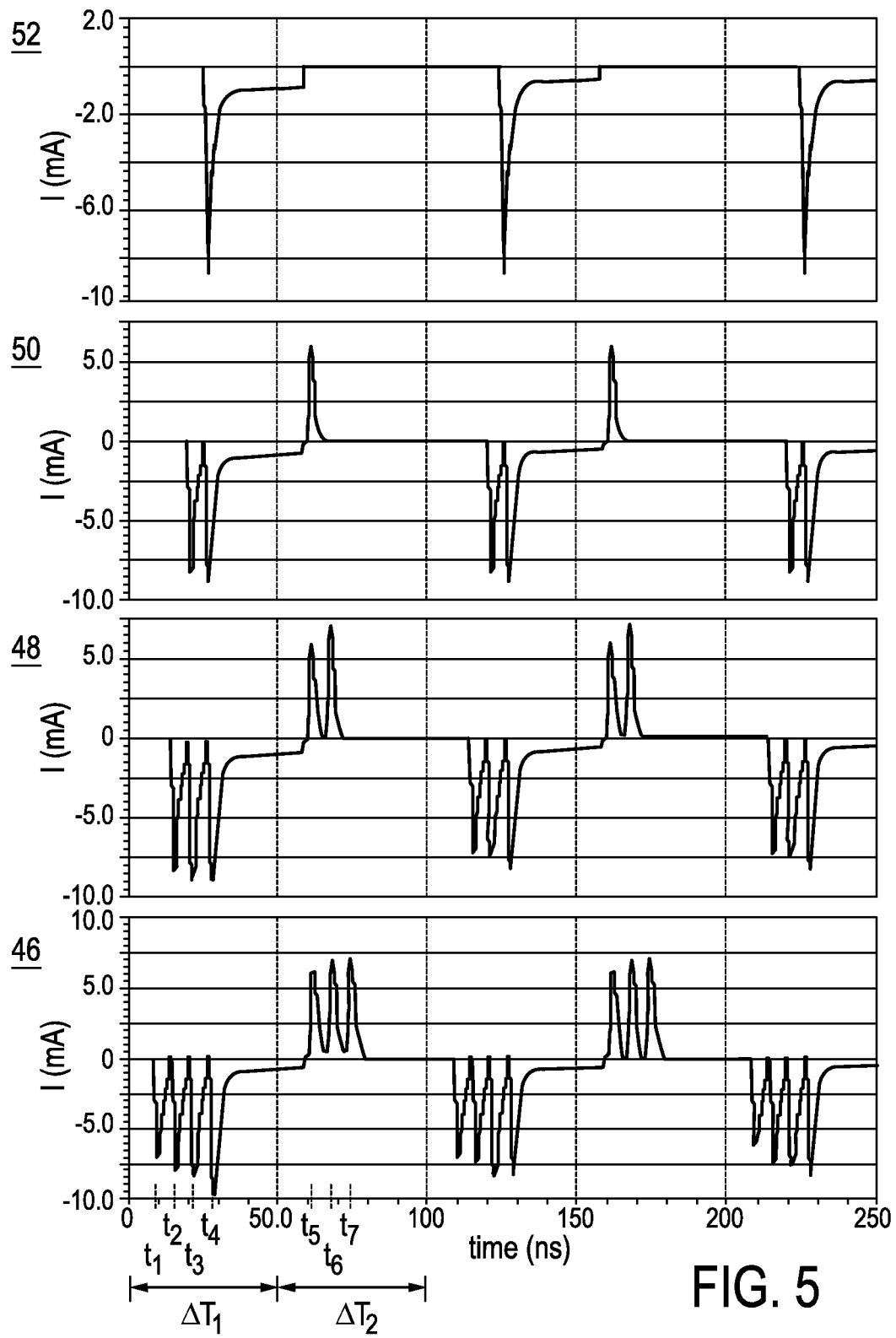
FIG. 5 shows four timing diagrams of the current in different voltage supply elements of the driver device of FIG. 2.

FIG. 5 shows four timing diagrams of the electrical current in each of the voltage supply elements 46-52 during the stepwise increasing and the stepwise decreasing of the pulsed drive voltage V14. During a first time portion Δt1 the pulsed drive voltage V14 is increased from 0 to V10 and during a second time portion Δt2 the pulsed drive voltage V14 is stepwise decreased from V10 to 0.

As shown in FIG. 5 the voltage supply element 46 provides a charge current during all steps at t1-t4 when the drive voltage V14 is increased. The voltage supply element 48 provides a charge current during the steps at t2, t3 and t4 except for the first step at t1. The voltage supply element 52 provides a charge current only during the last step at t4.

During the second time portion Δt2 the charge current is returned to the voltage supply element 46 by the discharging steps at t5, t6, t7. Further, the charge current is returned to the voltage supply element 48 during the discharging steps at t5 and t6 and the charge current is returned to the voltage supply element 50 during the discharging step t5. In general, the voltage supply elements provide the charge current to the transducer 12 in n charging steps and receive the charged current during n−1 discharging steps from the transducer.

The electrical energy provided during the charging of the transducer 12 can be calculated by $$E_{NC} = C*(1+2+\ldots+n)\left(\frac{(V10)^2}{2}\right) = \frac{C*(V10)^2}{2}\left(1+\frac{1}{n}\right)$$

wherein $E_{NC}$ is the electrical energy provided during the charging of the transducer 12 and n is the number of charging steps at t1-tn or discharging steps at tn+1+ . . . +t2n. Further, the electrical energy provided by discharging of the transducer 12 is:

$$E_{ND} = -C*(1+2+\ldots+n-1)\left(\frac{(V10)^2}{2}\right) = \frac{C*(V10)^2}{2}\left(1-\frac{1}{n}\right)$$

wherein $E_{ND}$ is the electrical discharging energy and n is the amount of charging steps at t1-t4 or discharging steps at t5-t8. The dissipated energy during a complete cycle comprises the charging cycle Δt1 and the discharging cycle Δt2 can be calculated by:

$$E_{NS} = E_{NC} + E_{ND} = C\frac{(V10)^2}{2}$$

wherein $E_{NS}$ is the dissipated energy or in other words the energy loss. For n=1, the dissipated energy is identical to the state of the art and for n=∞ the dissipated energy is theoretically 0. Since the value n is limited to the amount of voltage supply elements 46-52 (for n=4), the value n is limited. Increasing the value of n will complicate the circuitry of a driver device 40 and will increase the series resistance of the voltage supply elements 46-52. Preferably the value of n is between 2 and 5.

Figure 6:
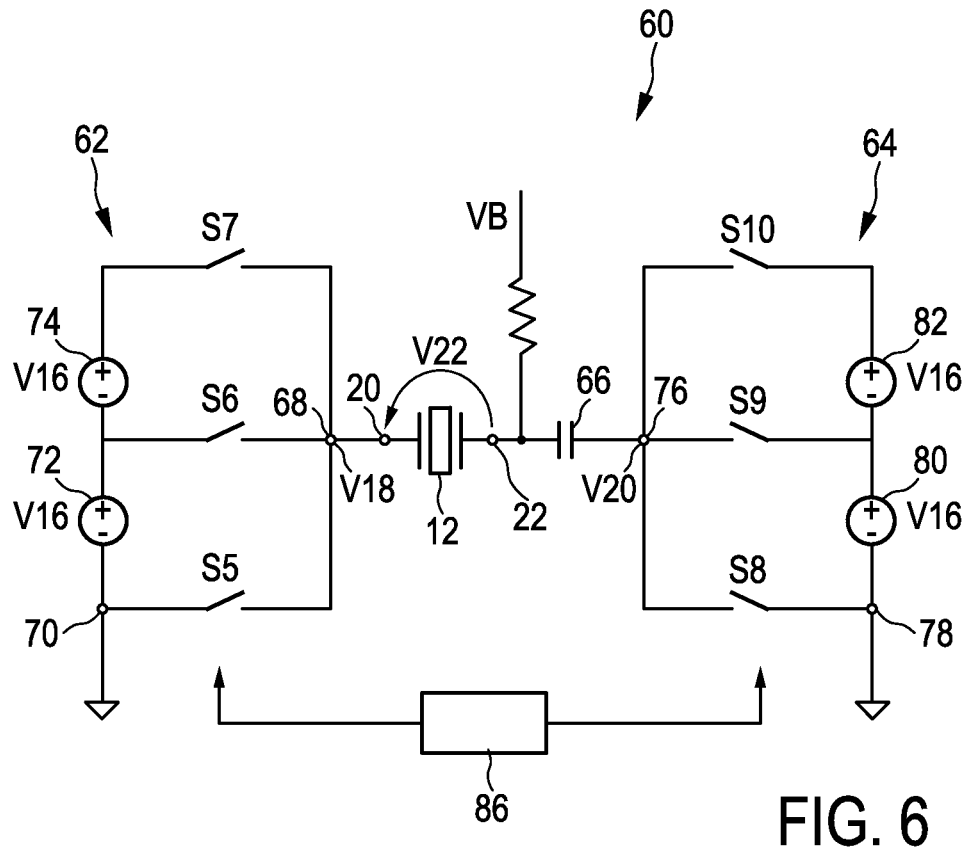
FIG. 6 shows a schematic block diagram of a second embodiment of the driver device for driving an ultrasound transducer.

FIG. 6 shows a driver device according to a second embodiment of the present invention. The driver device in FIG. 5 is generally denoted by 60. The driver device 60 comprises a first portion 62 and a second portion 64. The first portion 62 is connected to the first input terminal 20 of the ultrasound transducer 12 and the second portion 64 is connected via a capacitor 66 to the second input terminal 22 of the ultrasound transducer 12.

The first portion 62 comprises a first output terminal 68 and a second output terminal 70. The first output terminal 68 is connected to the first input terminal 20 of the ultrasound transducer 12. The second output terminal 70 is connected to neutral. The first portion 62 comprises two voltage supply elements 72, 74 connected in series to each other. The voltage supply elements 72, 74 each provide the intermediate voltage V16. The first portion 62 further comprises three controllable switches S5, S6, S7. The controllable switches S5, S6, S7 are connected to the first output terminal 68 and to each of the voltage potentials provided by the voltage supply elements 72, 74. By switching one of the controllable switches S5, S6, S7 the respective voltage potential 0, V16 or 2*V16 is provided to the output terminal 68.

The second portion is identical to the first portion 62 and comprises a first output terminal 76 and a second output terminal 78. The first output terminal 76 is connected to the capacitor 66 and the second output terminal 78 is connected to neutral. The second portion 64 comprises two voltage supply elements 80, 82 connected in series to each other and each providing the intermediate voltage V16.

In practice, source 74 and source 82 may be combined in one physical source, source 72 and source 80 may also be combined in one physical source.

The first output terminal 76 is connectable to each of the voltage potentials provided by the voltage supply elements 80, 82, so that the voltage potential 0, V16 and 2*V16 can be provided to the first output terminal 76.

The first portion 62 of the driver device 60 provides at the first output terminal 68 a voltage potential V18 and the second portion 64 provides at the first output terminal 76 a voltage potential V20. Voltage supply means are connected to the second input terminal 22 of the ultrasound transducer 12 to provide a bias voltage VB as a voltage offset between the second input terminal 22 and the voltage potential V18. This is applicable to a cMUT device, wherein a PZT device does not need the bias voltage (VB). The driver device 60 further comprises a control unit 86, which is connected to the control switches S5-S10 and provided to control the control switches S5-S10.

By switching the control switches S5, S6, S7 the voltage potential V18 can be provided as stepwise rising or stepwise falling voltage potential. Accordingly by switching the control switches S8, S9, S10, the voltage potential V20 can be provided as stepwise rising or stepwise falling voltage potential.

Figure 7:
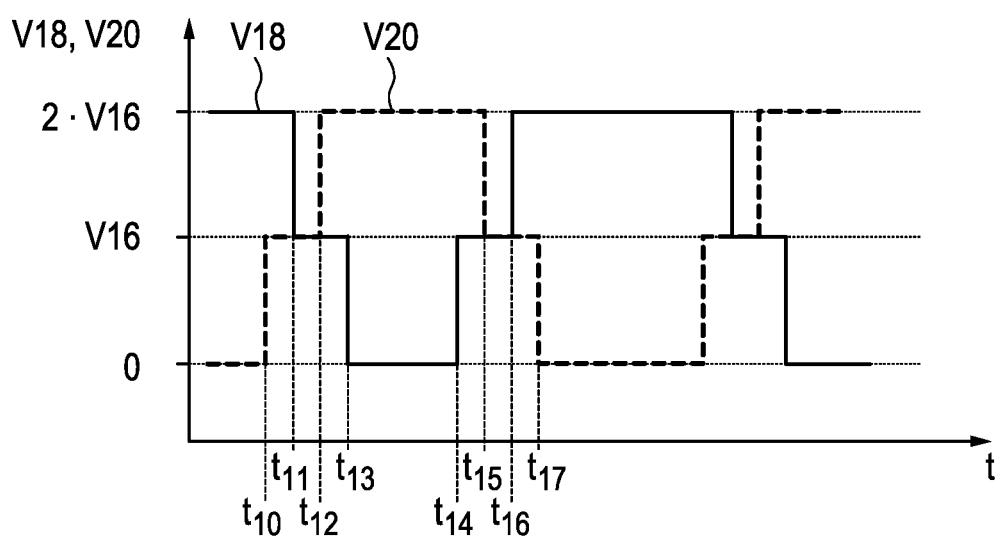
FIG. 7 shows a timing diagram of a driving pulse provided by the driver device of FIG. 6.

In FIG. 7 a timing diagram of the voltage potentials V18 and V20 is schematically shown. V18 is shown as solid line and V20 is shown as dashed line.

The voltage potential V20 is increased from 0 to V16 at t10 by switching the control switch S8 off and switching the control switch S9 on. At t11 the voltage potential V18 is reduced from 2*V16 to V16 by switching the control switch S7 off and switching the control switch S6 on. The voltage potential V20 is increased from V16 to 2*V16 at t12 by switching the control switch S9 off and the control switch S10 on. The voltage potential V18 is reduced from V16 to 0 at t13 by switching the control switch S6 off and the control switch S5 on.

Vice versa, the voltage potential V18 is increased by two steps from 0 to 2*V16 and the voltage potential V20 is reduced in two voltage steps from 2*V16 to 0 in two steps at t14 to t17.

The bias voltage VB is identical to 2*V16 or in other words 0.5*V10 and having a negative polarity so that an offset between the second input terminal 22 and the first output terminal 76 is provided and the voltage potentials V18 and V20 are shifted by the amount of 2*V16. Hence, a drive voltage V22 between the first and the second input terminals 20, 22 is achieved, that rises stepwise by voltage steps identical to the intermediate voltage level V16 between t10 and t13 and is reduced stepwise by the voltage steps identical with the intermediate voltage levels between t14 and t17. Hence, the pulsed drive voltage V22 is identical with the pulsed drive voltage V14 shown in FIG. 3 including the advantages describe above.

The driver devices 40, 60 can also change the amplitude of the drive voltages V14, V22. It is also possible to provide an intermediate voltage level to provide a beam shaping. E.g. in a two dimensional (2D) transducer array it is possible to adapt the amplitude of the drive voltages V14, V22 provided to the outer transducer relative the drive voltages V14, V22 provided to the inner transducer to optimize the beam profile.

While the invention has been illustrated and described in detail in the drawings and foregoing description, such illustration and description are to be considered illustrative or exemplary and not restrictive; the invention is not limited to the disclosed embodiments. Other variations to the disclosed embodiments can be understood and effected by those skilled in the art in practicing the claimed invention, from a study of the drawings, the disclosure, and the appended claims.

In the claims, the word "comprising" does not exclude other elements or steps, and the indefinite article "a" or "an" does not exclude a plurality. A single element or other unit may fulfill the functions of several items recited in the claims. The mere fact that certain measures are recited in mutually different dependent claims does not indicate that a combination of these measures cannot be used to advantage.

Any reference signs in the claims should not be construed as limiting the scope.

The invention claimed is:

1. An ultrasound transducer comprising:
a transducer element having an input terminal; and
a driver device coupled to the transducer element and the driver device comprising:
an output terminal for providing an alternating drive voltage to a load applied to the transducer element;
a plurality of voltage supply elements for providing intermediate voltage levels;
a plurality of controllable connecting means each associated to one of the voltage supply elements for connecting the voltage supply elements to the output terminal and for supplying one of the intermediate voltage levels or a sum of a plurality of the intermediate voltage levels as the alternating drive voltage to the output terminal; and
a second output terminal, wherein the drive voltage is provided between the output terminal and the second output terminal, and wherein the output terminal is connected to the input terminal of the transducer element.

2. The transducer of claim 1, wherein the voltage supply elements are connected in series to each other.

3. The transducer of claim 1, wherein the connecting means comprise a plurality of controllable switches each connected to one voltage supply element and to the output terminal.

4. The transducer of claim 1, wherein the voltage supply elements are separate voltage sources, each providing one of the intermediate voltage levels.

5. The transducer of claim 1, wherein the voltage supply elements are voltage divider elements forming a series connection, wherein the series connection comprises input terminals for connecting the driver device to an external power supply.

6. The transducer of claim 1, wherein the voltage supply elements are voltage conversion units connected to an external power supply for converting an external voltage to the intermediate voltage levels.

7. The transducer of claim 1, further comprising a control unit for controlling the controllable connecting means, wherein the control unit is provided for connecting the voltage supply elements sequentially to the output terminal for providing a stepwise rising or a stepwise falling drive voltage.

8. The transducer of claim 1, further comprising voltage supply means connected to the second output terminal for supplying a bias voltage to the second output terminal.

9. The transducer of claim 8, wherein the control unit is provided for controlling the first and the second plurality of connecting means and wherein the control unit is provided for connecting the voltage supply elements sequentially to the respective output terminal to provide a stepwise rising or falling drive voltage.

10. The transducer of claim 1, further comprising a second plurality of voltage supply elements for providing intermediate voltage levels and a second plurality of controllable connecting means each associated to one of the second voltage supply elements for connecting the second voltage supply elements to the second output terminal.

11. An ultrasound imaging system comprising
the ultrasound transducer of claim 1, wherein one or more transducer elements comprise a capacitive micro-machined ultrasound transducer.

12. The transducer of claim 1, wherein the second output terminal is connected to neutral.

13. A method for driving a capacitive load in an ultrasound transducer, the method comprising:
using a drive device, providing an alternating drive voltage to a load from an output terminal of the drive device to an input terminal of a transducer element in the ultrasound transducer;
providing a plurality of intermediate voltage levels by means of a plurality of voltage supply elements; and
connecting the voltage supply elements sequentially to the load to provide a stepwise rising or stepwise falling voltage as the alternating drive voltage to the load.

* * * * *